United States Patent [19]

Capener et al.

[11] Patent Number: 5,477,174
[45] Date of Patent: Dec. 19, 1995

[54] RAMP GENERATOR

[75] Inventors: Paul H. Capener; David S. Farrance, both of Farrance, England

[73] Assignee: Smiths Industries Public Limited Company, London, England

[21] Appl. No.: 369,157

[22] Filed: Jan. 5, 1995

[51] Int. Cl.$^6$ ................................ H03K 4/06; G06G 7/64
[52] U.S. Cl. .................... 327/131; 327/135; 327/137; 327/336; 327/345
[58] Field of Search ..................... 327/131, 134, 327/135, 136, 137, 336, 345, 339

[56] References Cited

U.S. PATENT DOCUMENTS

| | | | |
|---|---|---|---|
| 3,764,831 | 10/1973 | Zwitter et al. | 327/336 |
| 3,882,486 | 5/1975 | Montefusco et al. | 327/135 |
| 3,914,623 | 10/1975 | Clancy | 327/134 |
| 4,225,825 | 9/1980 | Watts | 327/134 |
| 4,581,585 | 4/1986 | Bristol | 327/134 |
| 5,394,020 | 2/1995 | Nienaber | 327/58 |

FOREIGN PATENT DOCUMENTS 1573724  8/1980  United Kingdom .

*Primary Examiner*—Timothy P. Callahan
*Assistant Examiner*—Trong Phan
*Attorney, Agent, or Firm*—Pollock, Vande Sande & Priddy

[57] ABSTRACT

A ramp generator has an integrator, which provides a ramp output, and a counter, which counts a clock signal during the rise period. The counter and clock are arranged so that when the actual rise time is equal to the desired rise time, the counter overflows and returns to zero. If the rise time is too slow, the counter will contain a count at the end of the rise period. A register is connected to receive this count and an adder adds the contents of the register to the contents of the adder repeatedly each time a clock pulse is generated. The adder has an output connected to the input of the integrator and, each time the adder overflows, supplies a correction pulse to the integrator so that its rise rate is increased.

5 Claims, 1 Drawing Sheet

RAMP GENERATOR

BACKGROUND OF THE INVENTION

This invention relates to ramp generators.

Ramp generators have an operational amplifier integrator circuit that charges and discharges a capacitor. Because capacitors tend to have large tolerances and values that vary with change in temperature, it is difficult to produce an accurate and constant rise time.

BRIEF SUMMARY OF THE INVENTION

It is an object of the present invention to provide an improved ramp generator.

According to one aspect of the present invention there is provided a ramp generator having integrator means arranged to provide a ramp output, the generator including means for measuring the difference between the rise and time of the ramp output to reach an upper limit and the desired rise time to reach the limit, and emans for altering the rise time of the integrator means to reduce the difference.

The means for measuring the difference between the rise time and the desired rise time may include a counter arranged to count a clock signal during the rise time of the integrator means. The capacity of the counter and the clock rate of the clock signal are preferably selected such that the counter overflows and returns to a start value when the rise time equals the desired rise time. The means for measuring the difference between the rise time and the desired rise time may include an adder arranged to add the contents of the counter at the end of a rise period. The adder may be arranged to provide an output to an input of the integrator to increase the rate of rise of the integrator. The adder may be arranged to add the contents of the counter at the end of a rise period to the previous contents of the adder repeatedly for each clock pulse and to provide an output to the integrator means each time that the adder overflows. The generator preferably includes a register arranged to store the count of the counter at the end of the rise period and to retain this count until the end of the following rise period. The rise time of the ramp output before altering the rise time is preferably arranged to be greater than the desired rise time.

A ramp generator and its method of operation, in accordance with the present invention, will now be described, by way of example, with reference to the accompanying drawings.

DETAILED DESCRIPTION OF THE PREFERRED EMBODIMENT

Figure 1:
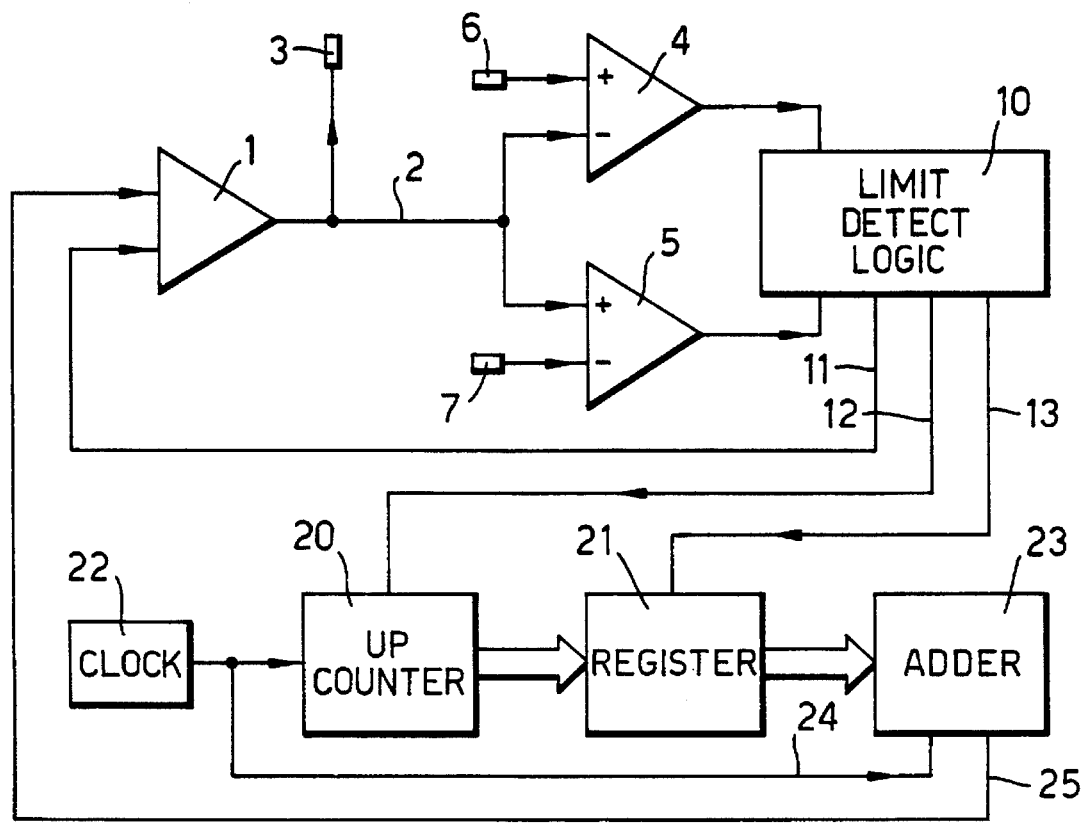
FIG. 1 is a schematic diagram of the generator.

The generator includes an operational amplifier integrator 1 that provides a ramp output on line 2 to the output 3 of the generator. The ramp output is also supplied to one input of each of two comparators 4 and 5. One comparator 4 has the ramp output supplied to its negative input and has its positive input connected to a source 6 of reference voltage defining the upper limit of the ramp. The other comparator 5 has the ramp output supplied to its positive input and has its negative input connected to a source 7 of reference voltage defining the lower limit of the ramp. The outputs of the two comparators 4 and 5 are supplied to a limit detect logic unit 10 having three outputs 11, 12 and 13 connected to a circuit for measuring the difference between the actual rise time and the desired rise time and altering the rise time to reduce the difference. More particularly, the output 11 is connected to an input of the integrator 1 and provides a signal to the integrator when the upper limit is reached. The output on line 12 is connected to a counter 20 and provides an enable signal during the ramp rise period. The output on line 13 is connected to a register 21 and provides a store signal to the register at the end of the rise period.

The counter 20 is connected to receive a clock signal from a clock 22 and provides an output to the register 21. The register 21, in turn, is connected to an adder 23 that also receives the clock signal from the clock 22 via line 24. The adder 23 has an output connected to an input of the integrator via line 25.

Figure 2:
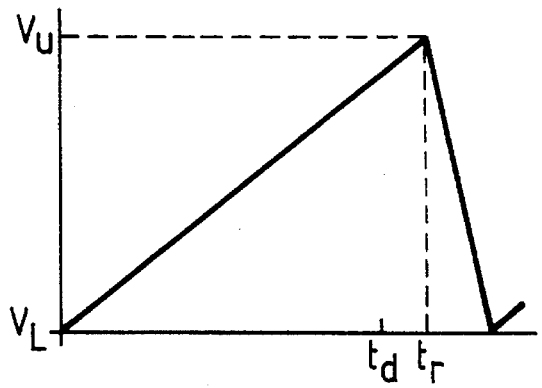
FIG. 2 shows a part of the waveform of the output of the generator.

In operation, the voltage of the output of the integrator 1 rises, in the manner shown in FIG. 2, as a straight line, from its lower limit $V_L$ to its upper limit $V_u$, as set by the comparator 4. When the upper limit is reached, the output of the comparator 4 changes, thereby causing the unit 10 to provide an output on line 11, which triggers the integrator 1 to switch from a rise to a rapid fall.

During the rise period $t_r$ of the ramp, the counter 20 is enabled by the output on line 12, so that it counts the clock pulses produced by the clock 22. When the rise of the ramp ceases, the output on line 12 also ceases, causing the counter 20 to stop counting. The capacity of the counter 20 and the clock rate of the clock 22 are chosen so that the counter will overflow once and return to its zero or start value if the rise time $t_r$ of the ramp signal is equal to the target or desired time $t_d$. If, however, the rise time $t_r$ is shorter or longer (as illustrated in FIG. 2) than desired, the counter 20 will contain a count different from the zero or start value, when counting ceases at the end of the ramp rise.

Figure 3:
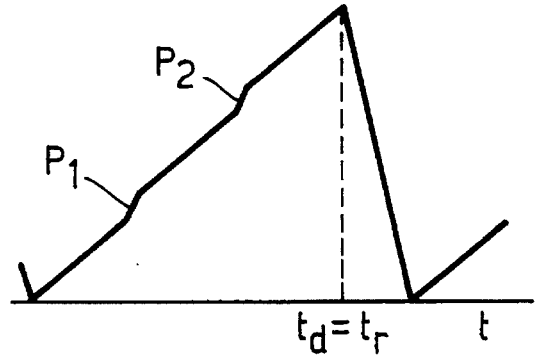
FIG. 3 shows another part of the waveform of the output of the generator.

The contents of the counter 20 are passed to the register 21 and are stored in the register by a signal on line 13 at the end of the rise period. The count value is held in the register 21 during the next ramp rise but the counter 20 resumes counting during the next rise, from its previous value. The adder 23 adds the contents of the register 21 to the adder's previous value each time that it receives a clock pulse on line 24. When the adder 23 overflows, it produces a carry signal on line 25 to the integrator 1. Initially, the contents of the adder might be zero and, if the ramp time $t_r$ were equal to the desired value $t_d$, the register contents would also be zero. In this case, the contents of the adder 23 would remain zero for each clock pulse and no output would be supplied to the integrator on line 25. If, however, the ramp rise time $t_r$ were to depart from the desired time $t_d$, this would cause a count to be entered in the register 21 the value of which would depend on the extent of deviation of the rise time from the target. The adder 23 would then add the value of the register 21 repeatedly for each clock pulse and, when it overflowed, it would provide a correction pulse signal on line 25 to the integrator 1. The result of this would be to increase momentarily the rate of rise of the ramp as shown by the points $P_1$ and $P_2$ in FIG. 3. The frequency with which the adder 23 supplies correction pulses to the integrator 1 is dependent on the extent of deviation of the rise time $t_r$ from the desired time $t_d$. FIG. 3 illustrates only two correction pulses $P_1$ and $P_2$ but, in general, a larger number of smaller pulses would be used. When the correction pulses reduce the rise time $t_r$ to the desired time $t_d$, the value of counter 20, and hence the contents of the register 21, at the end of the rise period will be the same as that at the end of the previous period. The adder 23, therefore, will continue producing the correction pulses on line 25 with the same frequency. The frequency of these digital correction pulses rapidly stabilizes at a value that sets the ramp rise time $t_r$ to the desired time $t_d$.

The rise time $t_r$ of the integrator 1, without correction, is chosen to be longer than desired because the correction pulses will increase the rise rate and thereby reduce the rise time. The rise time $t_r$ could fall below the desired rise time $t_d$, as a result of too many correction pulses from the adder 23. If this should happen, the count of the counter 20 at the end of the rise period would be less than that of the previous period. This would cause a lower value in the register 21 and hence reduce the frequency of the correction pulses produced by the adder 23 until the rise time is increased to $t_d$.

The resolution of the counter 20, register 21 and adder 23 are chosen to give the ramp generator the required accuracy.

What we claim is:

1. A ramp generator comprising: an integrator, said integrator providing a ramp output that rises from a lower limit to an upper limit in a rise time; a comparator; a connection between the integrator and the comparator, said comparator providing an output when said integrator output reaches the upper limit; a clock, said clock producing a clock signal; a counter; means connecting the counter to said clock to receive said clock signal; means connecting said counter to said comparator to receive the output of said comparator so that the counter counts the clock pulses during the rise time; a register; means connecting the register to said counter so that the register stores the count of said counter at the end of the rise time; an adder; means connecting the adder to said register; means connecting said adder to said clock so that the adder adds the contents of said register repeatedly to the contents of the adder for each clock pulse; and means connecting an output of said adder to an input of said integrator, said adder producing an output pulse to said integrator each time that the contents of said adder overflows, so that the rise time of said integrator is reduced and the difference between the actual and desired rise times is thereby reduced.

2. A ramp generator comprising: an integrator, said integrator providing a ramp output that rises from a lower limit to an upper limit in a rise time; a clock, said clock producing a clock signal; a counter; means connecting the clock to the counter so that the counter counts the clock signal during said rise time, the counter having a capacity and the clock signal having a clock rate that are selected such that the counter overflows and returns to a start value at the end of the desired rise time, such that the contents of the counter at the end of the actual rise time is indicative of the difference between the actual rise time and the desired rise time; a register; a connection between the output of the counter and an input of the register such that the register contains the contents of the counter at the end of the actual rise time; an adder; means connecting an input of the adder to an output of the register, the adder periodically adding the contents of the register to the contents of the adder; and means connecting an output of the adder to an input of the integrator, the adder supplying a signal to the integrator to reduce said difference.

3. A ramp generator according to claim 2 wherein said adder supplies an output to the integrator to increase the rate of rise of the integrator.

4. A ramp generator according to claim 2 or 3, wherein the adder adds the contents of the counter at the end of a rise time to the previous contents of the adder repeatedly for each clock pulse and provides an output to the integrator each time that the adder overflows.

5. A ramp generator according to claim 2 wherein said register stores the count of said counter at the end of the rise period and retains said count until the end of the following rise period.

* * * * *